United States Patent
Cowley et al.

(10) Patent No.: US 11,588,454 B2
(45) Date of Patent: Feb. 21, 2023

(54) POWER MANAGEMENT IN TRANSCEIVERS

(71) Applicant: Intel Corporation, Santa Clara, CA (US)

(72) Inventors: Nicholas P. Cowley, Wroughton (GB); Isaac Ali, Bristol (GB); William L. Barber, Bampton (GB)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 16/925,948

(22) Filed: Jul. 10, 2020

(65) Prior Publication Data

US 2021/0006216 A1   Jan. 7, 2021

Related U.S. Application Data

(63) Continuation of application No. 16/251,476, filed on Jan. 18, 2019, now Pat. No. 10,715,092, which is a continuation of application No. 15/659,857, filed on Jul. 26, 2017, now Pat. No. 10,224,883, which is a continuation of application No. 14/643,164, filed on Mar. 10, 2015, now Pat. No. 9,729,112, which is a continuation of application No. 14/255,444, filed on Apr. 17, 2014, now Pat. No. 9,000,843, which is a continuation of application No. 13/330,412, filed on Dec. 19, 2011, now Pat. No. 8,742,843.

(51) Int. Cl.
*H03F 3/24* (2006.01)
*H03G 3/30* (2006.01)
*H03F 1/02* (2006.01)
*H03G 3/20* (2006.01)

(52) U.S. Cl.
CPC ............ *H03F 3/24* (2013.01); *H03F 1/0211* (2013.01); *H03F 1/0216* (2013.01); *H03G 3/20* (2013.01); *H03G 3/3042* (2013.01); *H03G 3/3047* (2013.01); *H03F 2200/294* (2013.01); *H03F 2200/504* (2013.01); *H03F 2203/20* (2013.01)

(58) Field of Classification Search
CPC ...................................................... H03F 3/24
See application file for complete search history.

(56) References Cited

U.S. PATENT DOCUMENTS

| | | | | |
|---|---|---|---|---|
| 8,432,224 B1* | 4/2013 | Woo | ...................... | H03F 1/0238 330/285 |
| 9,515,626 B2* | 12/2016 | Lesso | .................. | H03M 1/0624 |
| 2002/0183019 A1* | 12/2002 | Dent | ...................... | H03F 1/0222 455/108 |
| 2005/0088226 A1* | 4/2005 | Robinson | ............... | H03F 1/0288 330/10 |
| 2008/0074209 A1* | 3/2008 | Ceylan | ..................... | H03C 5/00 332/144 |
| 2009/0004981 A1* | 1/2009 | Eliezer | ................... | H03F 1/3247 455/127.1 |
| 2009/0091384 A1* | 4/2009 | Sorrells | ................. | H03F 1/0211 330/207 R |

(Continued)

*Primary Examiner* — Patricia T Nguyen
(74) *Attorney, Agent, or Firm* — KDB Firm PLLC

(57) ABSTRACT

Various embodiments are directed to apparatuses and methods to generate a first signal representing modulation data and a second signal representing an amplitude of the modulation data, the first signal and the second signal to depend on an output signal and vary a power supply voltage to a gain stage in proportion to the amplitude of the modulation data.

17 Claims, 10 Drawing Sheets

(56) References Cited

U.S. PATENT DOCUMENTS

| | | | | |
|---|---|---|---|---|
| 2010/0246713 | A1* | 9/2010 | Vromans | H03F 3/189 327/155 |
| 2012/0052825 | A1* | 3/2012 | Southcombe | H03F 3/245 455/127.2 |
| 2015/0098523 | A1* | 4/2015 | Lim | H04L 27/368 375/297 |
| 2021/0067097 | A1* | 3/2021 | Wang | H02M 3/1584 |

* cited by examiner

100

300

500

600

800

900

1000

POWER MANAGEMENT IN TRANSCEIVERS

CROSS-REFERENCE TO RELATED APPLICATIONS

This application is a continuation of, claims the benefit of and priority to previously filed U.S. patent application Ser. No. 16/251,476 filed Jan. 18, 2019, entitled "Power Management in Transceivers", which is a continuation of, claims the benefit of and priority to previously filed U.S. patent application Ser. No. 15/659,857 filed Jul. 26, 2017 issued as U.S. Pat. No. 10,224,883, which is a continuation of, claims the benefit of and priority to previously filed U.S. patent application Ser. No. 14/643,164 filed Mar. 10, 2015 issued as U.S. Pat. No. 9,729,112, which is a continuation of, claims the benefit of and priority to previously filed U.S. patent application Ser. No. 14/255,444 filed Apr. 17, 2014 issued as U.S. Pat. No. 9,000,843, which is a continuation of, claims the benefit of and priority to previously filed U.S. patent application Ser. No. 13/330,412 filed Dec. 19, 2011 issued as U.S. Pat. No. 8,742,843, all of which are incorporated herein by reference in their entireties.

BACKGROUND

Power amplifier stages may process varying amplitude signals and may be implemented such that an output stage can support a maximum output voltage swing. This may define a maximum supply voltage (Vcc) to prevent saturation of a transconductance stage. The linearity of the output stage may typically be set to deliver the required linearity at the maximum output. As a consequence the power consumed by the output stage may be disadvantageously constant at a maximum value set by the maximum output amplitude. This may be undesirable since power is wasted when the transceiver is transmitting at a reduced output amplitude. Accordingly, there may be a need for improved techniques to solve these and other problems.

DETAILED DESCRIPTION

Figure 1:
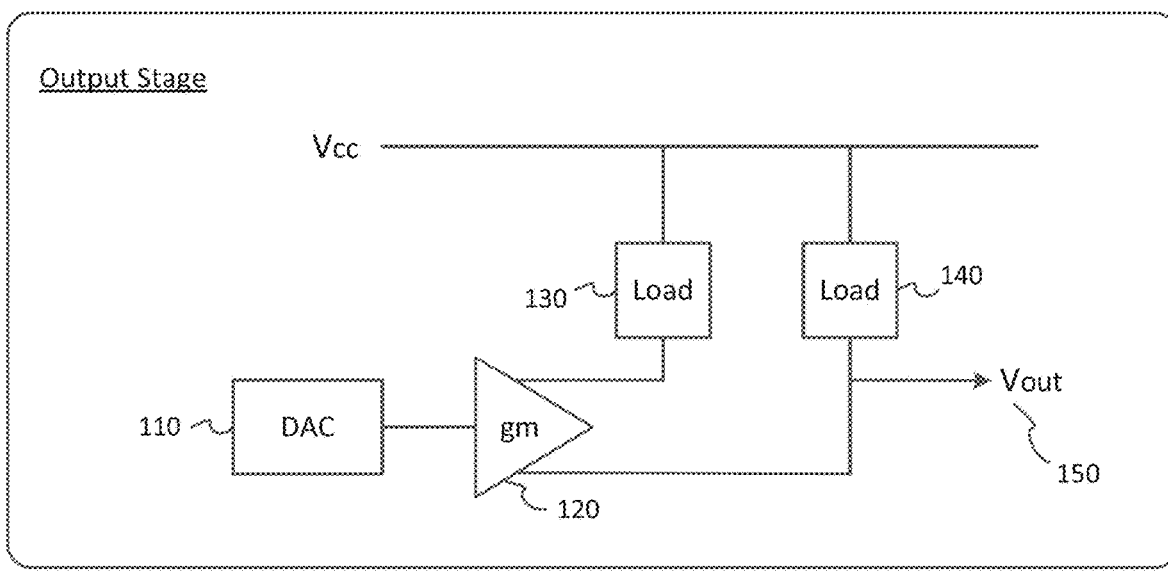
FIG. 1 illustrates a block diagram of a currently implemented typical output stage.

Various embodiments are disclosed that reduce power in transceiver equipment. In particular, power reduction in equipment designed for transmitting signals characterized by a wide dynamic range (e.g., variation in signal amplitude). An example of such equipment may be a transmitter within a transceiver device. However, the embodiments described herein may also be applied to the receiver path within a transceiver device. For purposes of illustration, the embodiments described herein reference Multimedia Over Coax Alliance (MoCA) transceiver systems such as deployed in cable television systems or satellite television systems. The embodiments are not limited to this context and may be extended to any application having similar variable transmission and reception power requirements.

MoCA applications typically deploy a unicast transmission with channel bandwidths ranging from 50 to 100 MHz within an overall transmission band of approximately 950 to 1700 MHz. The transmission amplitude may be in the range 70 to 110 dBuV, or 9 mVpp to 0.9 Vpp, and the reception amplitude may be in the range 35 to 110 dBuV, or 0.2 mVpp to 0.9 Vpp, into a characteristic impedance of 75 ohms.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

FIG. 1 illustrates a block diagram of a currently implemented typical output stage. The output stage 100 shows a transconductance stage comprised of an amplifier (gm) gain stage 120 sourcing current into an output load 130, 140. In this example the output signal (Vout) 150 is taken single ended from a single load 140. In other embodiments the output 150 may be taken differentially from both loads 130, 140 and then converted to single ended by an external transformation stage (not shown). A power amplifier is implemented such that the output stage 100 can support a maximum output voltage swing (single ended or differential). This may define a maximum supply voltage (Vcc) to prevent saturation of the transconductance stage. For example, in the single ended output, Vcc may be set at least 0.9 V above the transconductance stage output voltage to prevent saturation. In addition, there may be a DC component to the headroom corresponding to any standing current.

The linearity of the output stage 100, which may set by the current density and negative feedback applied within the transconductance stage, may typically be set to deliver the required linearity at the maximum output.

As a consequence the power consumed by the output stage 100 (Vcc*I) is disadvantageously constant at a maximum value set by the maximum output amplitude, which defines a maximum Vcc and current density, irrespective of the output signal amplitude. This may be undesirable since power may be wasted when the transceiver is transmitting at a reduced from peak output amplitude.

Figure 2:
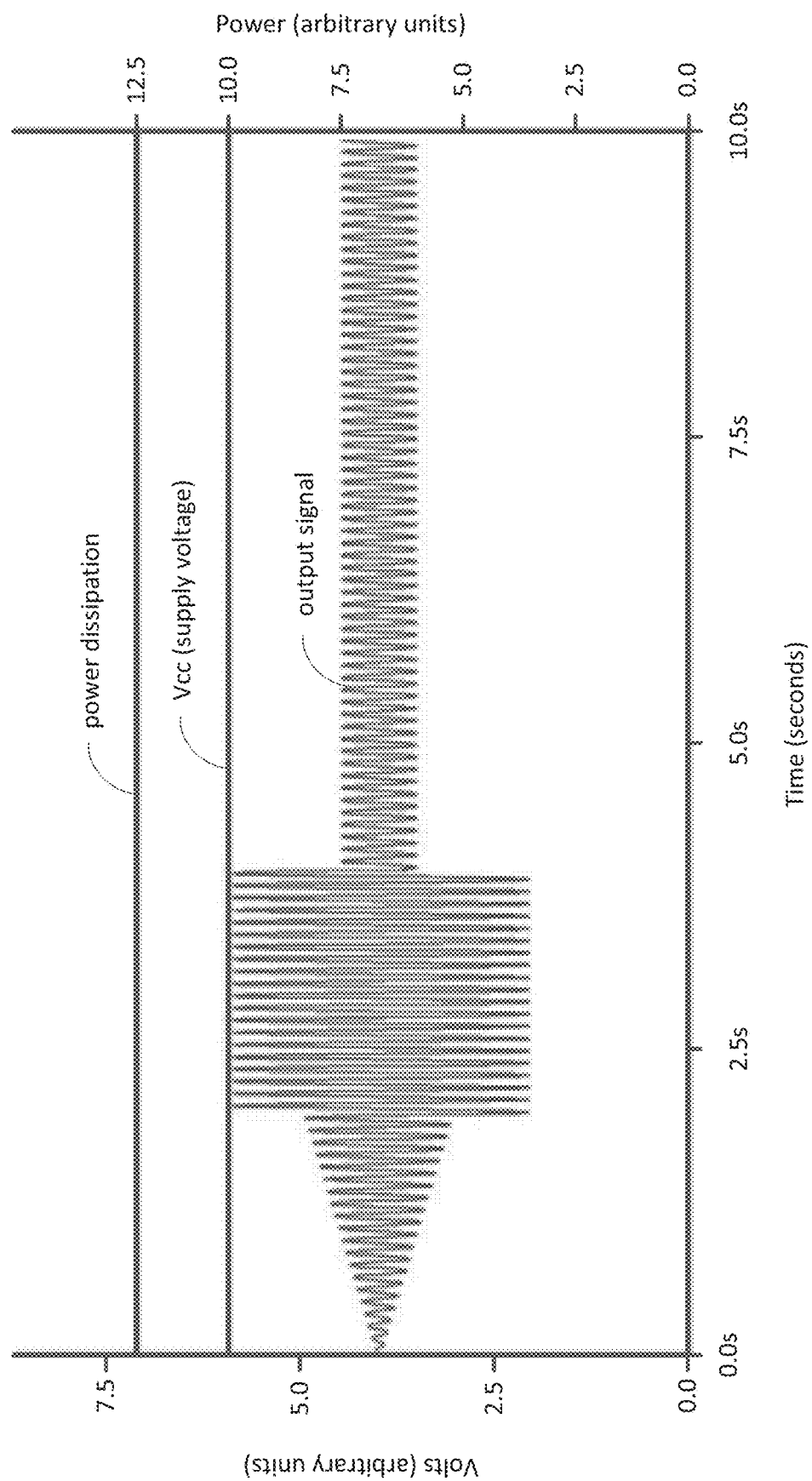
FIG. 2 illustrates a graphical illustration of a power trace in arbitrary units as a function of Vcc and the output according to the typical output stage of FIG. 1.

FIG. 2 illustrates a graphical illustration of a power trace in arbitrary units as a function of Vcc and the output signal according to the typical output stage of FIG. 1. In this illustration, the output signal can be divided into three phases: a ramp up phase, a peak phase, and a steady state phase. The output signal ramps up between 0.0 seconds and approximately 2.0 seconds. At this point the output signal jumps to peak amplitude and remains there until approximately 3.5 seconds. The output signal then falls to a steady state for the rest of the time line out to 10 seconds. It should be noted that the time values and output signal envelope are generally arbitrary and for illustrative purposes only. During the entire timeline the supply voltage Vcc and power dissipation levels remain unchanged at approximately 6.0 and 12.5 respectively. Again the voltage and power values are expressed in arbitrary units for purposes of illustration. Thus, Vcc and by consequence the power dissipation do not decrease when the output signal is at a reduced from peak amplitude.

Various embodiments are directed to apparatuses and methods to reduce average power dissipation in transceiver stages such as power amplifiers and low noise amplifiers (LNAs) that process varying output amplitudes by varying the supply voltage in sympathy with the amplitude of the signal and/or the stage current density which may also be varied in sympathy with the signal amplitude.

A first embodiment of an output stage as applied in a transmission power amplifier may include a DAC that converts a digital output signal to an analog modulated carrier which outputs to a transconductance stage. The transconductance stage may be preceded by a variable gain stage or may contain a gain control facility. The output stage may be coupled to the output of the transconductance stage, where the output stage provides a single ended output to a cable network, for instance, with a characteristic impedance of 75 ohms. The output stage may include a differential to single ended transformation. An output amplitude set stage may produce a control signal to the variable gain stage to control the output amplitude. In addition the output amplitude set stage may also control the current density of the output stage in dependence of the output amplitude, whereby a greater amplitude requires a greater current density to provide the required linearity in the output stage. An amplitude to Vcc correlator stage may receive the output from the amplitude set stage and may generate an output proportional to either the commanded output amplitude or the commanded current density or both. A buck regulator whose voltage reference input may be coupled to the output of the amplitude to Vcc correlator stage and whose voltage output may provide a supply voltage to the output stage. The buck regulator may be implemented such that a loop bandwidth is greater than a rate of variation in output amplitude. The buck regulator may, in alternate embodiments, be a boost regulator. The buck (or boost) regulator may be implemented with an analog or digital control loop.

In operation through application of the voltage regulator to generate the output stage, the supply voltage Vcc may be arranged to vary in proportion to a commanded output amplitude. This variation may correspond to a linear relationship with the output amplitude (e.g., when the output amplitude increases by $\Delta Vpp$ then Vcc increases by $K1*\Delta V$) or to a linear relationship with the current density (e.g., when the current density increases by $\Delta I$ then Vcc increases by $K2*\Delta I*$load impedance) or both, where K1 and K2 are constants.

A nominal DC voltage on Vcc may be set corresponding to the condition with no output signal. This may be a condition with no output, with minimum current density, or both. This would be the minimum possible voltage to avoid saturation of the output stage and would be the minimum output voltage provided by the Buck (or boost) regulator.

When the output stage is transmitting, an amplitude to Vcc correlator stage may generate a control signal proportional to the output amplitude, current density, or both. Vcc may vary in sympathy with this control signal and hence the transmitted amplitude, with constituent elements of voltage amplitude, current density, or both.

Figure 5:
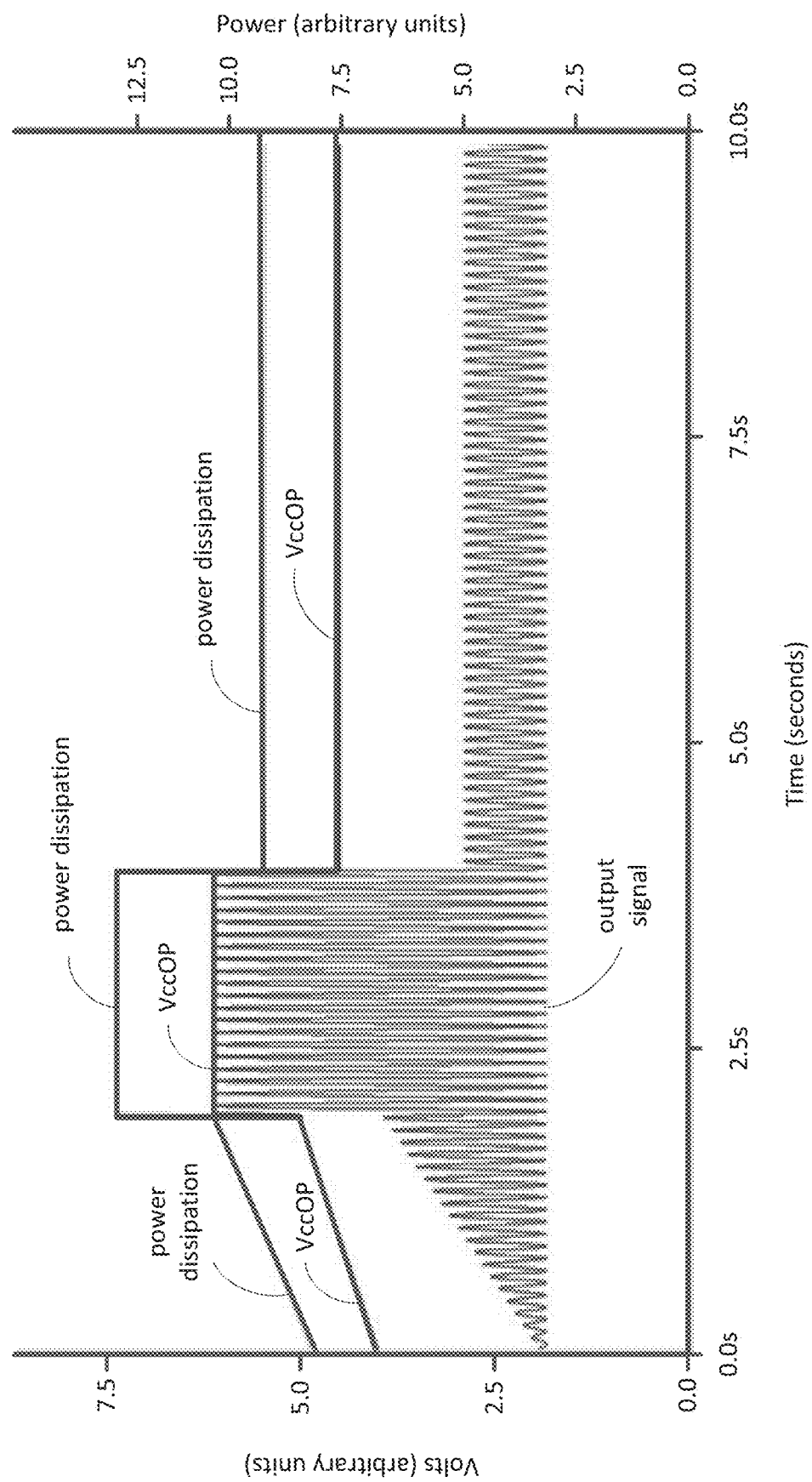
FIG. 5 illustrates a graphical illustration of a power trace in arbitrary units as a function of Vcc and the output according to the output stage of FIG. 3.
Figure 8:
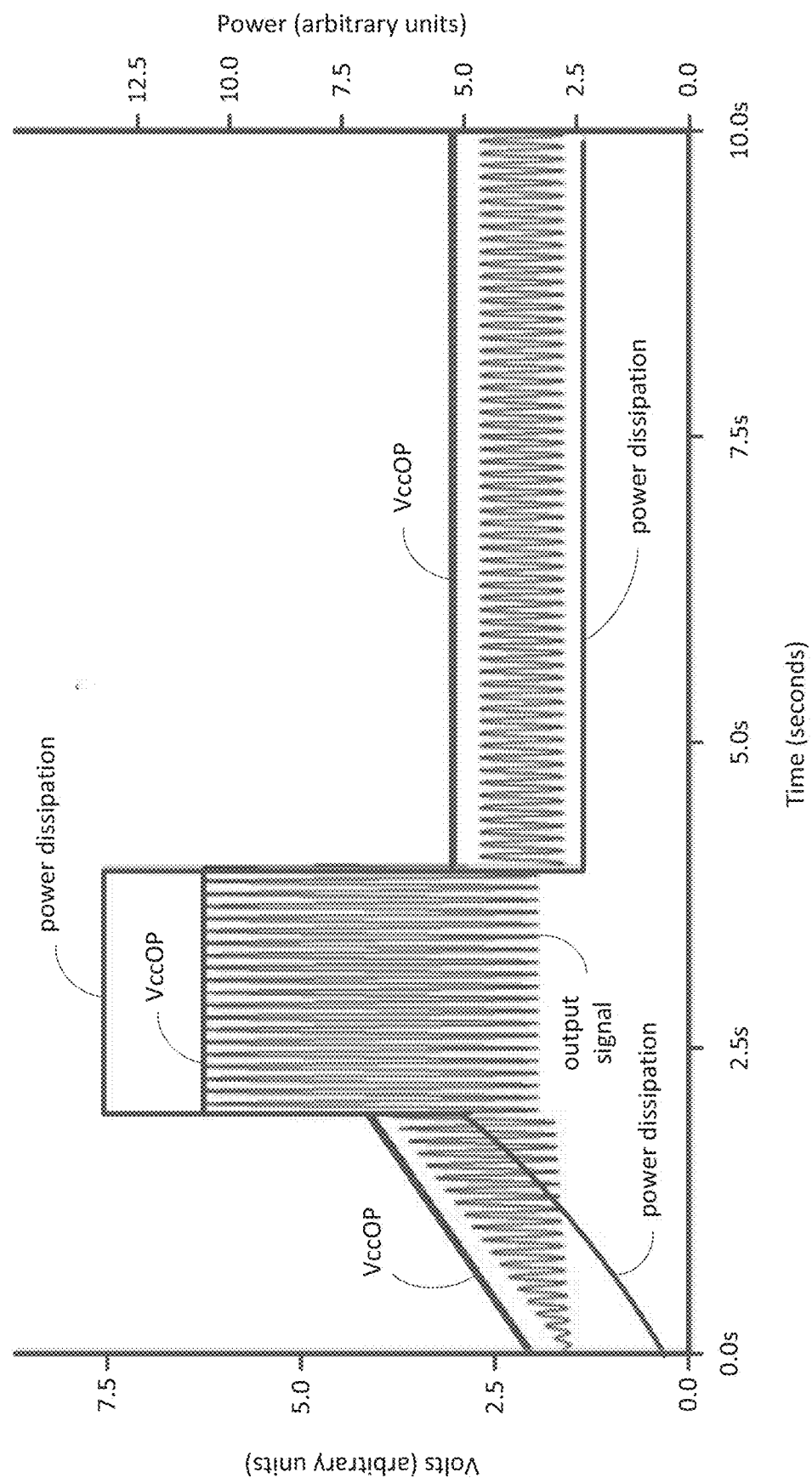
FIG. 8 illustrates a graphical illustration of a power trace in arbitrary units as a function of Vcc and the output according to the output stage of FIG. 6.

Idealized simulations comparing the typical output stage architecture with a Vcc control based architecture on amplitude only and with a Vcc control based architecture on both amplitude and current density are illustrated in, FIGS. 2, 5, and 8 respectively. The graphs of FIGS. 2, 5, and 8 had the same example modulation amplitude variation applied to the implementations of FIGS. 1, 3, and 6 respectively. Empirically comparing the power traces for the latter two embodiments, it can be clearly seen that when transmitting at below maximum output amplitude power is advantageously reduced.

While the embodiments described herein may be described with respect to a power amplifier stage, the embodiments could equally be deployed in any stage which processes a varying amplitude signal, such as, for example, an LNA receiving a signal of varying amplitude.

Figure 3:
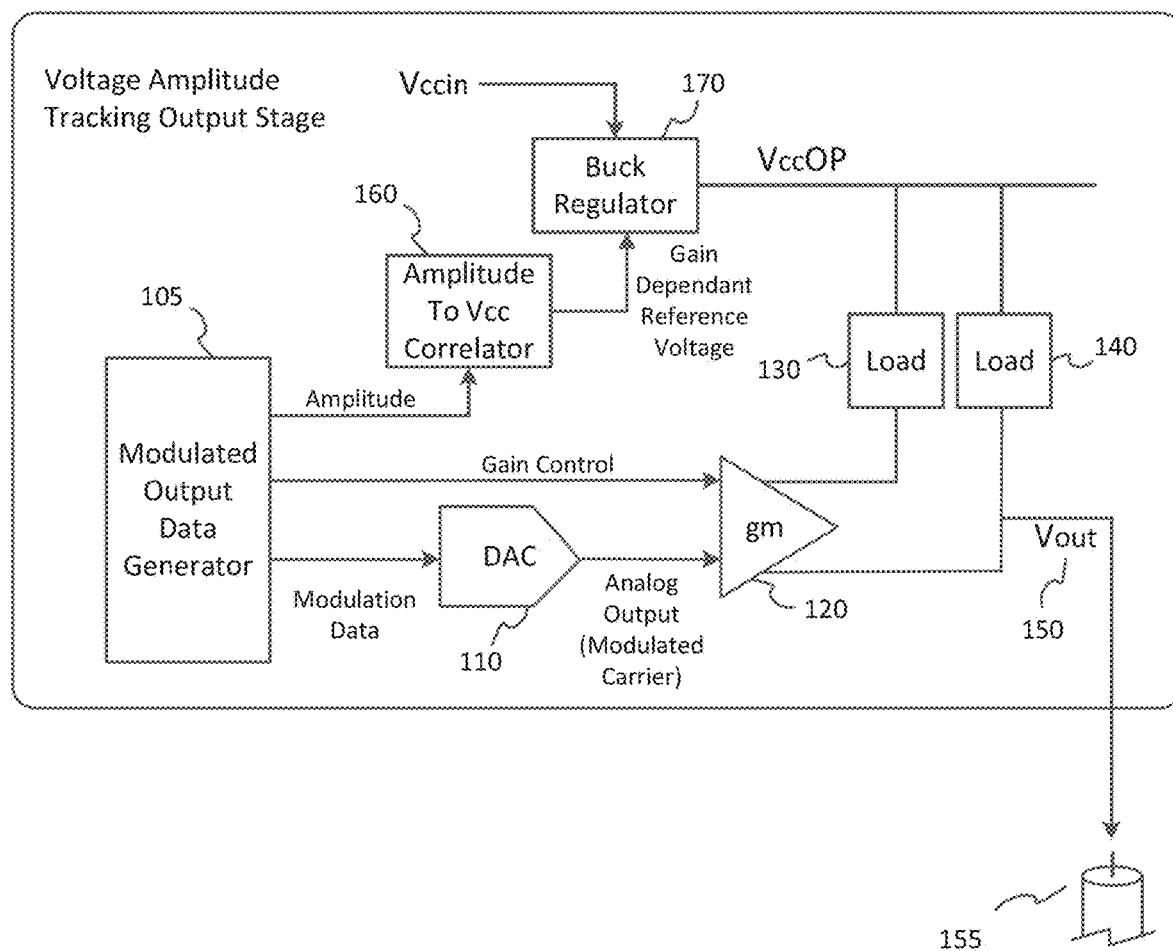
FIG. 3 illustrates a block diagram of an output stage implementing voltage amplitude tracking according to an embodiment of the disclosure.

FIG. 3 illustrates a block diagram of an output stage 300 implementing voltage amplitude tracking according to an embodiment of the disclosure. A modulated output data generator 105 may output two digital signals that depend on an output signal (Vout) 150. The output signal may be fed into a coaxial cable 155 having a characteristic impedance of 75 ohms.

A first digital signal may represent the modulation data and the second digital signal may represent an amplitude of the modulation data. The amplitude of the modulation data may correspond to the average of the modulation on the output signal to prevent it from reacting to short term variations in amplitude.

A digital-to-analog converter (DAC) 110 may convert the digital representation of the modulation data into an analog representation of the modulation data. The analog representation may be the modulated carrier or the modulation envelope. In the modulation envelope case, the analog output would be modulated onto a carrier (not shown).

The analog modulated carrier signal may be passed to an amplifier (gm) gain stage 120. The gain stage 120 may provide a variable gain to the modulated carrier into an output load 130, 140 to create an output signal Vout 150. The gain stage 120 may be a power amplifier (single ended or differential), for instance. The gain stage 120 may be powered by a modified supply voltage VccOP. The modified supply voltage VccOP may be provided by a buck regulator component 170.

One refinement to the output stage 300, termed voltage amplitude tracking, may reduce the average power dissipation for the entire output stage 300. Voltage amplitude tracking varies the supply voltage for the gain stage 120 in proportion to the amplitude of the modulation data. An amplitude to Vcc correlator component 160 converts the current amplitude of the modulation data into a required supply voltage (VccOP) for the gain stage 120. The required supply voltage VccOP may increase in proportion to the required amplitude of the output signal 150 and maintain an output bias on the gain stage 120 at a level appropriate to prevent clipping. Clipping may occur when the voltage on the load 130, 140 becomes too low.

The buck regulator 170 may be a switched mode DC to DC converter that may generate the supply voltage VccOP. VccOP may be controlled by the mark/space ratio of a pulse width modulated (PWM) generator (not shown). The PWM generator may be controlled by a feedback loop to set the output to a desired value. The buck regulator 170 may operate from an input voltage Vccin.

Figure 4:
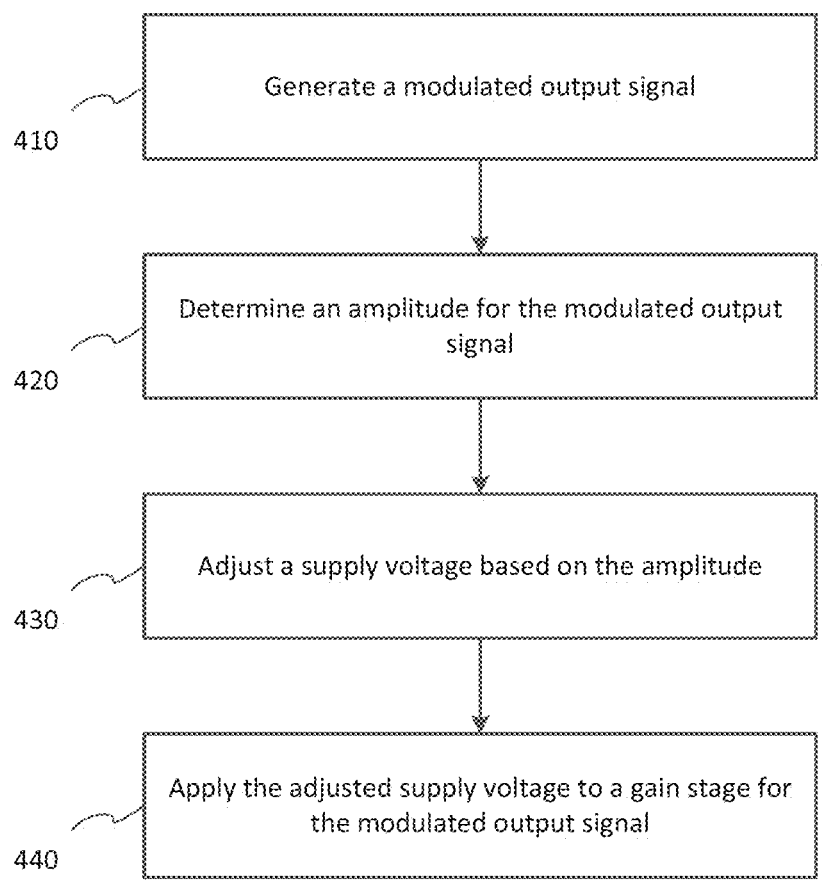
FIG. 4 illustrates one embodiment of a logic flow for the output stage of FIG. 3.

FIG. 4 illustrates one embodiment of a logic flow 400 for the output stage 300 of FIG. 3. The logic flow 400 may be representative of some or all of the operations executed by one or more embodiments described herein that may implement voltage amplitude tracking when managing power in a transceiver.

In the illustrated embodiment shown in FIG. 4, the logic flow 400 may generate a modulated output signal at block 410. For example, the modulated output data generator 105 may output two digital signals that depend on an output signal (Vout) 150. A first digital signal may represent the modulation data and the second digital signal may represent an amplitude of the modulation data. The amplitude of the modulation data may correspond to the average of the modulation on the output signal to prevent it from reacting to short term variations in amplitude. The embodiments are not limited in this context.

The logic flow 400 may determine an amplitude for the modulated output signal at block 420. For example, the amplitude to Vcc correlator component 160 may generate a control signal proportional to the output signal amplitude. The embodiments are not limited in this context.

The logic flow 400 may adjust or modify a supply voltage based on the amplitude of the modulated output signal 150 at block 430. For example, the buck regulator component 170 may convert the amplitude of the modulation data into a required supply voltage (VccOP) for the gain stage 120. The required supply voltage VccOP may be modified to increase or decrease in proportion to the required amplitude of the output signal 150 and maintain an output bias on the gain stage 120 at a level appropriate to prevent clipping. Clipping may occur when the voltage on the load 130, 140 becomes too low. The embodiments are not limited in this context.

The logic flow 400 may apply the adjusted or modified supply voltage VccOP to the gain stage 120 for the modulated output signal 150 at block 440. For example, the buck regulator component 170 may have a voltage reference input coupled to the output of the amplitude to Vcc correlator component 160 and may provide a supply voltage VccOP to the output stage. The buck regulator component 170 may be implemented such that a loop bandwidth is greater than a rate of variation in output amplitude. The buck regulator component 170 may, in alternate embodiments, be a boost regulator. The buck (or boost) regulator component 170 may be implemented with an analog or digital control loop. The embodiments are not limited in this context.

FIG. 5 illustrates a graphical illustration of a power trace in arbitrary units as a function of the supply voltage (VccOP) and the output signal according to the output stage of FIG. 3. FIG. 5 graphically represents the voltage amplitude tracking embodiment. In this illustration, the output signal can be divided into three phases: a ramp up phase, a peak phase, and a steady state phase. The output signal ramps up between 0.0 seconds and approximately 2.0 seconds. At this point the output signal jumps to peak amplitude and remains there until approximately 4.0 seconds. The output signal then falls to a steady state for the rest of the time line out to 10 seconds. It should be noted that the time, voltage, power values, and output signal envelope are expressed in arbitrary units for purposes of illustration.

During the ramp up phase, VccOP and the power dissipation levels track the peak amplitude of the output signal such that VccOP is approximately 4.0 when the output signal is at 2.0 at time 0.0 and rises (somewhat linearly) to approximately 4.6 when the output amplitude rises to approximately 3.7. Similarly, power dissipation linearly rises in proportion to the output signal amplitude during the ramp up phase. During the peak phase, VccOP jumps to and holds at a value of approximately 6.1 while power dissipation also jumps to and holds at a value of 12.5. During the steady state phase, the output signal may be operating at below peak levels. VccOP drops to and holds at a value of approximately 4.0 while power dissipation also drops to and holds at a value of approximately 7.5. Thus, VccOP and the power dissipation vary linearly when the output signal is at a "reduced from peak" amplitude. This results in reduced power dissipation when the output signal is not at peak amplitude because the supply voltage is tied to the current amplitude of the output signal rather than being set to always operate at the highest peak amplitude of the output signal.

Figure 6:
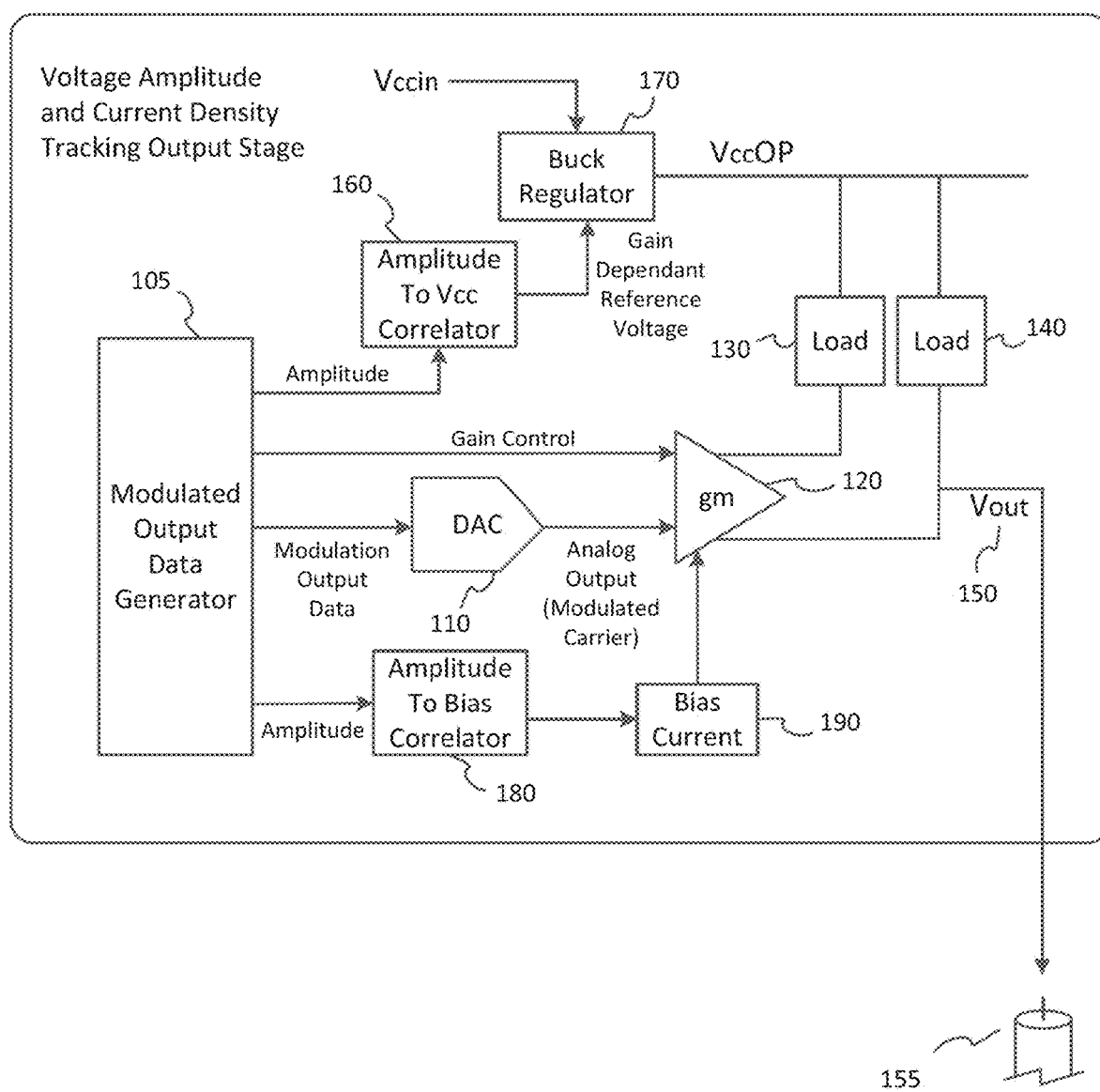
FIG. 6 illustrates a block diagram of an output stage implementing voltage amplitude and current density tracking according to an embodiment of the disclosure.

FIG. 6 illustrates a block diagram of an output stage 600 implementing voltage amplitude and current density tracking according to an embodiment of the disclosure. A modulated output data generator 105 may output two digital signals that depend on an output signal (Vout) 150. The output signal may be fed into a coaxial cable 155 having a characteristic impedance of 75 ohms.

A first digital signal may represent the modulation data and the second digital signal may represent an amplitude of the modulation data. The amplitude of the modulation data may correspond to the average of the modulation on the output signal to prevent it from reacting to short term variations in amplitude.

A digital-to-analog converter (DAC) 110 may convert the digital representation of the modulation data into an analog representation of the modulation data. The analog representation may be the modulated carrier or the modulation. In the modulation case, the analog output would be modulated onto a carrier (not shown).

The analog modulated carrier signal may be passed to an amplifier (gm) gain stage 120. The gain stage 120 may provide a variable gain to the modulated carrier into an output load 130, 140 to create an output signal Vout 150. The gain stage 120 may be a power amplifier, for instance. The gain stage 120 may be powered by a modified supply voltage VccOP. The modified supply voltage VccOP may be provided by a buck regulator component 170.

One refinement to the output stage 600, termed voltage amplitude tracking, may reduce the average power dissipation for the entire output stage 600. Voltage amplitude tracking varies the supply voltage for the gain stage 120 in proportion to the amplitude of the modulation data. An amplitude to Vcc correlator component 160 converts the current amplitude of the modulation data into a required supply voltage (VccOP) for the gain stage 120. The required supply voltage VccOP may increase in proportion to the required amplitude of the output signal 150 and maintain an output bias on the gain stage 120 at a level appropriate to prevent clipping. Clipping may occur when the voltage on the load 130, 140 becomes too low.

The buck regulator 170 may be a switched mode DC to DC converter that may generate the variable modified supply voltage VccOP. VccOP may be controlled by the mark/space ratio of a pulse width modulated (PWM) generator (not shown). The PWM generator may be controlled by a feedback loop to set the output to a desired value. The buck regulator 170 may operate from an input voltage Vccin.

A further refinement to the output stage 600, termed current density tracking, may further reduce power dissipation for the overall output stage 600. An amplitude to bias correlator component 180 may convert the current amplitude of the modulation data into a bias current 190 for the gain stage 120. The bias current 190 may increase in proportion to the required output signal 150 amplitude and maintain an output bias on the gain stage 120 at a level appropriate to prevent clipping.

In another embodiment, the input to the amplitude to bias correlator component 180 may come from the amplitude to Vcc correlator 160 or from VccOP. This is because VccOP and the bias current 190 may both be dependent on the output signal amplitude.

The bias current 190, in combination with the modified supply voltage VccOP, may provide sufficient current to achieve the required linearity for the output signal Vout 150. For instance, larger signals may require a larger bias current 190 to minimize distortion. Conversely, smaller signals may require a smaller bias current 190.

Figure 7:
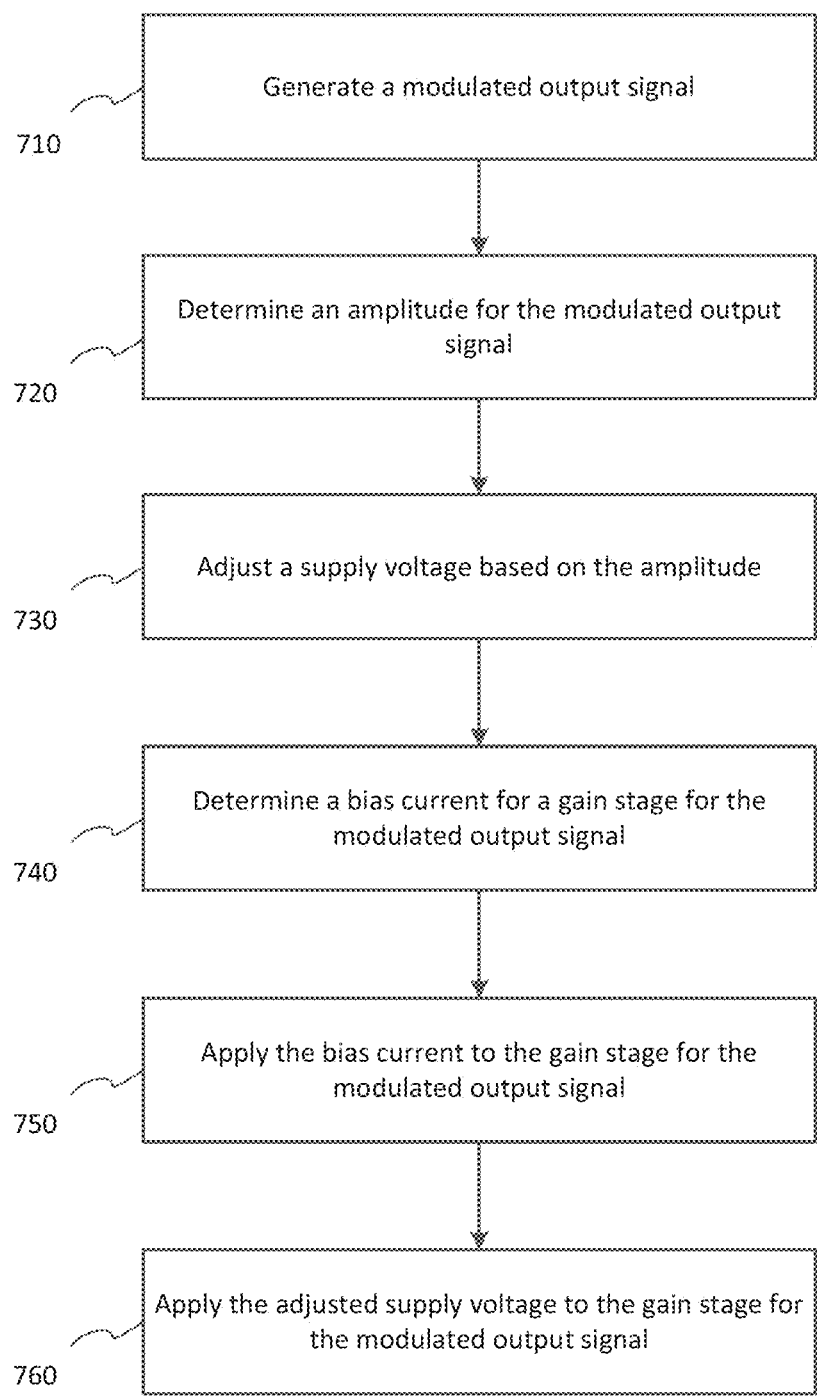
FIG. 7 illustrates one embodiment of a logic flow for the output stage of FIG. 6.

FIG. 7 illustrates one embodiment of a logic flow 700 for the output stage 600 of FIG. 6. The logic flow 700 may be representative of some or all of the operations executed by one or more embodiments described herein that may implement voltage amplitude and current density tracking when managing power in a transceiver.

In the illustrated embodiment shown in FIG. 7, the logic flow 700 may generate a modulated output signal at block 710. For example, the modulated output data generator 105 may output two digital signals that depend on an output signal (Vout) 150. A first digital signal may represent the modulation data and the second digital signal may represent an amplitude of the modulation data. The amplitude of the modulation data may correspond to the average of the modulation on the output signal to prevent it from reacting to short term variations in amplitude. The embodiments are not limited in this context.

The logic flow 700 may determine an amplitude for the modulated output signal at block 720. For example, the amplitude to Vcc correlator component 160 may generate a control signal proportional to the output signal amplitude. The embodiments are not limited in this context.

The logic flow 700 may adjust or modify a supply voltage based on the amplitude of the modulated output signal 150 at block 730. For example, the buck regulator component 170 may convert the amplitude of the modulation data into a required supply voltage (VccOP) for the gain stage 120. The required supply voltage VccOP may be modified to increase or decrease in proportion to the required amplitude of the output signal 150 and maintain an output bias on the gain stage 120 at a level appropriate to prevent clipping.

Clipping may occur when the voltage on the load 130, 140 becomes too low. The embodiments are not limited in this context.

The logic flow 700 may determine a bias current 190 for the gain stage 120 for the modulated output signal at block 740. For example, the amplitude to bias correlator component 180 may convert the amplitude of the modulation data into a bias current 190 for the gain stage 120. The bias current 190 may increase in proportion to the required output signal 150 amplitude and maintain an output bias on the gain stage 120 at a level appropriate to prevent clipping. The embodiments are not limited in this context.

The logic flow 700 may apply the bias current 190 to the gain stage 120 for the modulated output signal at block 750. For example, the bias current 190, in combination with the modified supply voltage VccOP, may provide sufficient current to the gain stage 120 to achieve the required linearity for the output signal Vout 150. For instance, larger signals may require a larger bias current 190 to minimize distortion. Conversely, smaller signals may require a smaller bias current 190. The embodiments are not limited in this context.

The logic flow 700 may apply the adjusted or modified supply voltage VccOP to the gain stage 120 for the modulated output signal 150 at block 740. For example, the buck regulator component 170 may have a voltage reference input coupled to the output of the amplitude to Vcc correlator component 160 and may provide a supply voltage VccOP to the output stage. The buck regulator component 170 may be implemented such that a loop bandwidth is greater than a rate of variation in output amplitude. The buck regulator component 170 may, in alternate embodiments, be a boost regulator. The buck (or boost) regulator component 170 may be implemented with an analog or digital control loop. The embodiments are not limited in this context.

FIG. 8 illustrates a graphical illustration of a power trace in arbitrary units as a function of Vcc and the output according to the output stage of FIG. 6. FIG. 8 graphically represents the voltage amplitude and current density tracking embodiment. In this illustration, the output signal can be divided into three phases: a ramp up phase, a peak phase, and a steady state phase. The output signal ramps up between 0.0 seconds and approximately 2.0 seconds. At this point the output signal jumps to peak amplitude and remains there until approximately 4.0 seconds. The output signal then falls to a steady state for the rest of the time line out to 10 seconds. It should be noted that the time, voltage, power values, and output signal envelope are expressed in arbitrary units for purposes of illustration.

During the ramp up phase, VccOP and the power dissipation levels track the amplitude of the output signal such that VccOP is approximately 4.0 when the output signal is at 2.0 at time 0.0 and rises (somewhat linearly) to approximately 4.6 when the output amplitude rises to approximately 3.7. Similarly, power dissipation starts lower and linearly rises in proportion to the output signal amplitude during the ramp up phase. During the peak phase, VccOP jumps to and holds at a value of approximately 6.1 while power dissipation also jumps to and holds at a value of approximately 12.5. During the steady state phase, the output signal may be operating at below peak levels. VccOP drops to and holds at a value of approximately 2.8 while power dissipation also drops to and holds at a value of approximately 2.5. Thus, VccOP and the power dissipation vary linearly when the output signal is at a "reduced from peak" amplitude. Combining voltage amplitude and current density tracking results in even greater reduced power dissipation when the output signal is not at peak amplitude.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Figure 9:
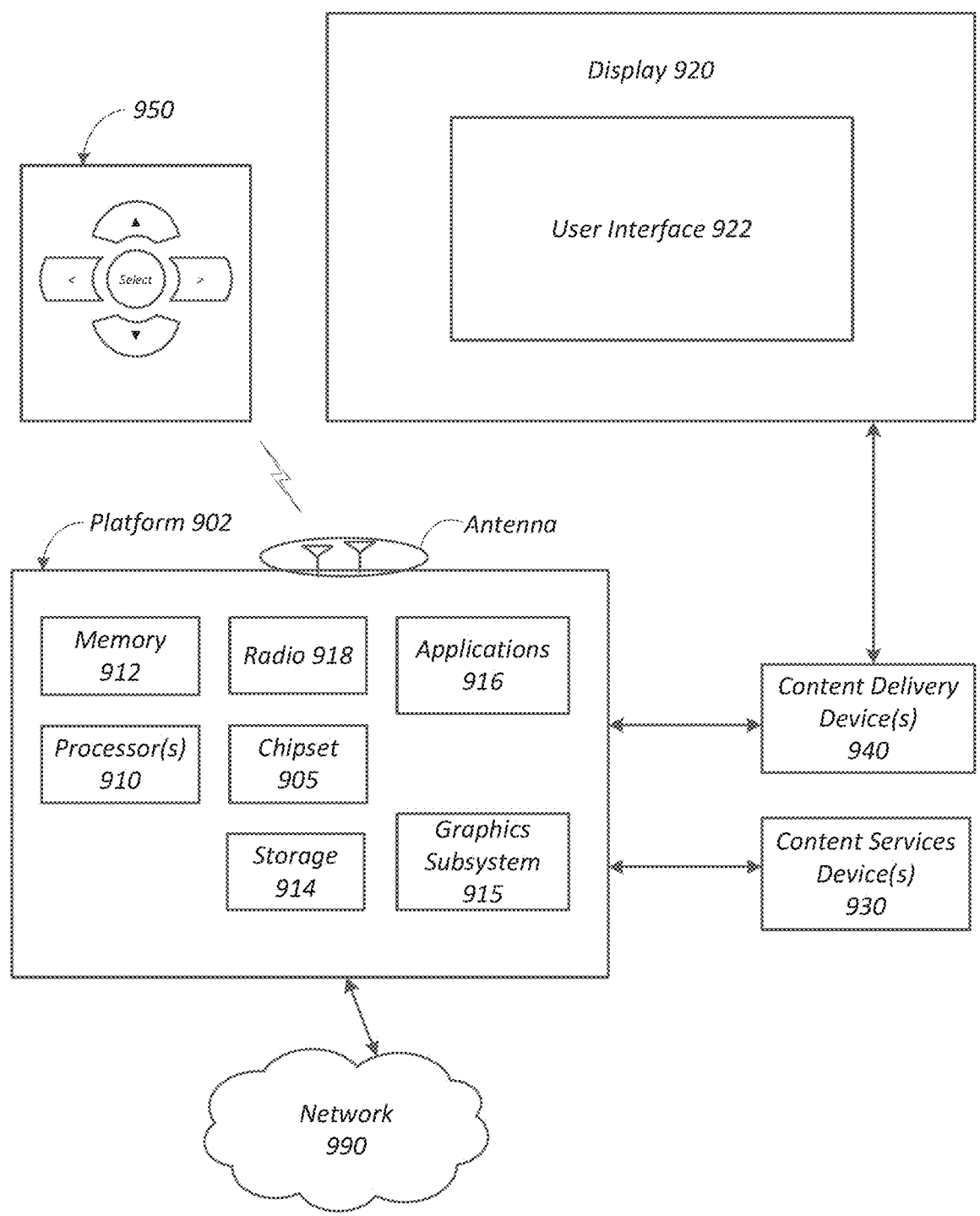
FIG. 9 illustrates an embodiment of a system that may be suitable for implementing embodiments of the disclosure.

FIG. 9 illustrates an embodiment of a system 900 that may be suitable for implementing the power management embodiments of the disclosure. In embodiments, system 900 may be a system capable of implementing the power management embodiments described above although system 900 is not limited to this context. For example, system 900 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 900 comprises a platform 902 coupled to a display 920. Platform 902 may receive content from a content device such as content services device(s) 930 or content delivery device(s) 940 or other similar content sources. A navigation controller 950 comprising one or more navigation features may be used to interact with, for example, platform 902 and/or display 920. Each of these components is described in more detail below.

In embodiments, platform 902 may comprise any combination of a chipset 905, processor(s) 910, memory 912, storage 914, graphics subsystem 915, applications 916 and/ or radio 918. Chipset 905 may provide intercommunication among processor 910, memory 912, storage 914, graphics subsystem 915, applications 916 and/or radio 918. For example, chipset 905 may include a storage adapter (not depicted) capable of providing intercommunication with storage 914.

Processor(s) 910 may be implemented as Complex Instruction Set Computer (CISC) or Reduced Instruction Set Computer (RISC) processors, x86 instruction set compatible processors, multi-core, or any other microprocessor or central processing unit (CPU). In embodiments, processor(s) 910 may comprise dual-core processor(s), dual-core mobile processor(s), and so forth.

Memory 912 may be implemented as a volatile memory device such as, but not limited to, a Random Access Memory (RAM), Dynamic Random Access Memory (DRAM), or Static RAM (SRAM).

Storage 914 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 914 may comprise technology to increase the storage performance enhanced protection for valuable digital media when multiple hard drives are included, for example.

Graphics subsystem 915 may perform processing of images such as still or video for display. Graphics subsystem 915 may be a graphics processing unit (GPU) or a visual processing unit (VPU), for example. An analog or digital interface may be used to communicatively couple graphics subsystem 915 and display 920. For example, the interface may be any of a High-Definition Multimedia Interface, DisplayPort, wireless HDMI, and/or wireless HD compliant techniques. Graphics subsystem 915 could be integrated into processor 910 or chipset 905. Graphics subsystem 915 could be a stand-alone card communicatively coupled to chipset 905.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 918 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 918 may operate in accordance with one or more applicable standards in any version.

In embodiments, display 920 may comprise any television type monitor or display. Display 920 may comprise, for example, a computer display screen, touch screen display, video monitor, television-like device, and/or a television. Display 920 may be digital and/or analog. In embodiments, display 920 may be a holographic display. Also, display 920 may be a transparent surface that may receive a visual projection. Such projections may convey various forms of information, images, and/or objects. For example, such projections may be a visual overlay for a mobile augmented reality (MAR) application. Under the control of one or more software applications 916, platform 902 may display user interface 922 on display 920.

In embodiments, content services device(s) 930 may be hosted by any national, international and/or independent service and thus accessible to platform 902 via the Internet, for example. Content services device(s) 930 may be coupled to platform 902 and/or to display 920. Platform 902 and/or content services device(s) 930 may be coupled to a network 960 to communicate (e.g., send and/or receive) media information to and from network 960. Content delivery device(s) 940 also may be coupled to platform 902 and/or to display 920.

In embodiments, content services device(s) 930 may comprise a cable television box, personal computer, network, telephone, Internet enabled devices or appliance capable of delivering digital information and/or content, and any other similar device capable of unidirectionally or bidirectionally communicating content between content providers and platform 902 and/display 920, via network 960 or directly. It will be appreciated that the content may be communicated unidirectionally and/or bidirectionally to and from any one of the components in system 900 and a content provider via network 960. Examples of content may include any media information including, for example, video, music, medical and gaming information, and so forth.

Content services device(s) 930 receives content such as cable television programming including media information, digital information, and/or other content. Examples of content providers may include any cable or satellite television or radio or Internet content providers. The provided examples are not meant to limit embodiments of the invention.

In embodiments, platform 902 may receive control signals from navigation controller 950 having one or more navigation features. The navigation features of controller 950 may be used to interact with user interface 922, for example. In embodiments, navigation controller 950 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 950 may be echoed on a display (e.g., display 920) by movements of a pointer, cursor, focus ring, or other visual indicators displayed on the display. For example, under the control of software applications 916, the navigation features located on navigation controller 950 may be mapped to virtual navigation features displayed on user interface 922, for example. In embodiments, controller 950 may not be a separate component but integrated into platform 902 and/or display 920. Embodiments, however, are not limited to the elements or in the context shown or described herein.

In embodiments, drivers (not shown) may comprise technology to enable users to instantly turn on and off platform 902 like a television with the touch of a button after initial boot-up, when enabled, for example. Program logic may allow platform 902 to stream content to media adaptors or other content services device(s) 930 or content delivery device(s) 940 when the platform is turned "off" In addition, chip set 905 may comprise hardware and/or software support for 5.1 surround sound audio and/or high definition 9.1 surround sound audio, for example. Drivers may include a graphics driver for integrated graphics platforms. In embodiments, the graphics driver may comprise a peripheral component interconnect (PCI) Express graphics card.

In various embodiments, any one or more of the components shown in system 900 may be integrated. For example, platform 902 and content services device(s) 930 may be integrated, or platform 902 and content delivery device(s) 940 may be integrated, or platform 902, content services device(s) 930, and content delivery device(s) 940 may be integrated, for example. In various embodiments, platform 902 and display 920 may be an integrated unit. Display 920 and content service device(s) 930 may be integrated, or display 920 and content delivery device(s) 940 may be integrated, for example. These examples are not meant to limit the invention.

In various embodiments, system 900 may be implemented as a wireless system, a wired system, or a combination of both. When implemented as a wireless system, system 900 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 900 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 902 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 9.

Figure 10:
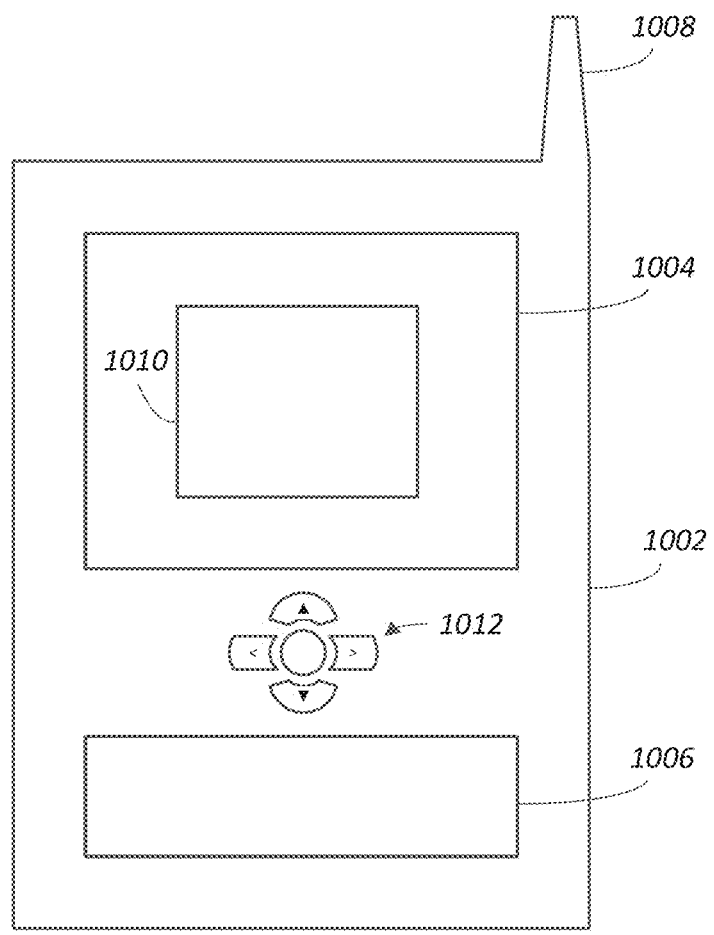
FIG. 10 illustrates embodiments of a small form factor device in which the system of FIG. 9 may be embodied.

As described above, system 900 may be embodied in varying physical styles or form factors. FIG. 10 illustrates embodiments of a small form factor device 1000 in which system 900 may be embodied. In embodiments, for example, device 1000 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 10, device 1000 may comprise a housing 1002, a display 1004, an input/output (I/O) device 1006, and an antenna 1008. Device 1000 also may comprise navigation features 1012. Display 1004 may comprise any suitable display unit for displaying information appropriate for a mobile computing device. I/O device 1006 may comprise any suitable I/O device for entering information into a mobile computing device. Examples for I/O device 1006 may include an alphanumeric keyboard, a numeric keypad, a touch pad, input keys, buttons, switches, rocker switches, microphones, speakers, voice recognition device and software, and so forth. Information also may be entered into device 1000 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

What is claimed is:

1. An apparatus, comprising:
   circuitry to provide a power supply voltage for a power amplifier based on an amplitude for a modulated carrier signal and a feedback loop for a first circuit, the circuitry comprising:
   the first circuit to determine the amplitude for the modulated carrier signal to be amplified by the power amplifier and to generate a pulse-width modulated signal based on the amplitude for the modulated carrier signal and the feedback loop; and
   a second circuit to output an amplitude varying bias signal based on the pulse-width modulated signal, to provide a bias signal to the power amplifier to cause the provided power supply voltage to vary based on the amplitude of the modulated carrier signal.

2. The apparatus of claim 1, further comprising a digital-to-analog converter to couple with the power amplifier to provide a bias current.

3. The apparatus of claim 1, wherein the bias signal comprises an amplitude varying signal based on the amplitude of the modulated carrier signal.

4. The apparatus of claim 1, further comprising a transconductance amplifier as the power amplifier.

5. The apparatus of claim 4, wherein the amplitude varying bias signal is a bias voltage for the power amplifier.

6. The apparatus of claim 5, the power amplifier comprised in a radio frequency (RF) transceiver.

7. The apparatus of claim 1, further comprising a modulated data generator to output a first digital signal representing modulation data and a second digital signal representing an amplitude of the modulation data.

8. The apparatus of claim 1, wherein the feedback loop comprises a digital feedback signal.

9. The apparatus of claim 1, wherein the feedback loop comprises an analog feedback signal.

10. A method, comprising:
   determining an amplitude for a modulated carrier signal to be amplified by a power amplifier;
   generating, by a pulse-width modulated generator circuit, a pulse-width modulated signal based on the amplitude for the modulated carrier signal and a feedback loop for the pulse-width modulated generator circuit; and
   outputting an amplitude varying bias signal based on the pulse-width modulated signal, to provide a bias signal to the power amplifier to cause a power supply voltage to vary based on the amplitude of the modulated carrier signal.

11. The method of claim 10, wherein the feedback loop comprises a digital feedback signal.

12. The method of claim 10, wherein the feedback loop comprises an analog feedback signal.

13. The method of claim 10, wherein the amplitude varying bias signal is a bias voltage for the power amplifier.

14. An apparatus, comprising:
   a power amplifier;
   tracking circuitry to provide a power supply voltage for the power amplifier based on an amplitude for a modulated carrier signal and a feedback loop for a first circuit, the circuitry comprising:
      the first circuit to determine the amplitude for the modulated carrier signal to be amplified by the power amplifier and to generate a pulse-width modulated signal based on the amplitude for the modulated carrier signal and the feedback loop; and
      a second circuit to output an amplitude varying bias signal based on the pulse-width modulated signal, to provide a bias signal to the power amplifier to cause the provided power supply voltage to vary based on the amplitude of the modulated carrier signal; and
   bias circuitry coupled with the power amplifier to provide a second bias signal to the power amplifier.

15. The apparatus of claim 14, wherein the amplitude varying bias signal is a bias voltage for the power amplifier.

16. The apparatus of claim 14, wherein the feedback loop comprises a digital feedback signal.

17. The apparatus of claim 14, wherein the feedback loop comprises an analog feedback signal.

* * * * *